(12) United States Patent
Blasczak et al.

(10) Patent No.: US 8,971,366 B2
(45) Date of Patent: Mar. 3, 2015

(54) KILLSWITCH ARRANGEMENT FOR AND METHOD OF REGULATING LASER OUTPUT POWER IN ELECTRO-OPTICAL READERS

(71) Applicant: Symbol Technologies, Inc., Schaumburg, IL (US)

(72) Inventors: Matthew D. Blasczak, Shirley, NY (US); Chang Chen, Stony Brook, NY (US); Peter Fazekas, Bayport, NY (US); James R. Giebel, Centerport, NY (US); Vladimir Gurevich, Stony Brook, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 13/667,108

(22) Filed: Nov. 2, 2012

(65) Prior Publication Data

US 2014/0126594 A1 May 8, 2014

(51) Int. Cl.
*H01S 3/00* (2006.01)

(52) U.S. Cl.
USPC .................. 372/38.02; 372/38.07; 372/38.09

(58) Field of Classification Search
CPC ............ H01S 5/06825; H01S 5/06832; H01S 5/06808
USPC ........................................................ 372/38.02
See application file for complete search history.

(56) References Cited

U.S. PATENT DOCUMENTS

| | | | |
|---|---|---|---|
| 3,292,661 A * | 12/1966 | Everett | 138/26 |
| 5,175,413 A * | 12/1992 | Holling et al. | 219/519 |
| 5,276,697 A | 1/1994 | Davis | |
| 5,666,045 A | 9/1997 | Grodevant | |
| 5,999,549 A | 12/1999 | Freitag et al. | |
| 6,229,833 B1 | 5/2001 | Noda et al. | |
| 6,771,679 B2 * | 8/2004 | Schie | 372/38.1 |
| 7,608,806 B2 | 10/2009 | Draper et al. | |
| 7,609,736 B2 * | 10/2009 | Difazio et al. | 372/38.09 |
| 7,664,150 B2 * | 2/2010 | Bell | 372/38.1 |
| 7,665,852 B2 * | 2/2010 | Yavid et al. | 353/85 |
| 7,701,990 B2 * | 4/2010 | Morimoto et al. | 372/38.06 |
| 2007/0047605 A1 * | 3/2007 | Barkan | 372/38.09 |
| 2007/0133633 A1 * | 6/2007 | Difazio et al. | 372/38.02 |
| 2010/0074286 A1 * | 3/2010 | Difazio et al. | 372/38.09 |
| 2010/0158055 A1 * | 6/2010 | Giebel | 372/29.011 |
| 2011/0315771 A1 * | 12/2011 | Weitzner et al. | 235/462.06 |

FOREIGN PATENT DOCUMENTS

WO 2007137087 11/2007

OTHER PUBLICATIONS

Leenes et al., "PRIME White Paper," EU Project Prime, Privacy and Identity Management for Europe, Third and Final Version, May 15, 2008, Retrieved from the Internet URL: https://www.prime-project.eu/prime_products/whitepaper/PRIME-Whitepaper-V3.pdf on Jul. 25, 2014, pp. 1-22.

* cited by examiner

*Primary Examiner* — Xinning Niu
*Assistant Examiner* — Vu A Vu
(74) *Attorney, Agent, or Firm* — Nong-Qiang Fan

(57) ABSTRACT

Output power of a laser beam emitted by a laser in an electro-optical reader is regulated by storing a killswitch byte in non-volatile memory, and by checking whether the killswitch byte is in a default state or a kill state prior to performing reading. A controller detects a fault condition and responsively changes the killswitch byte to the kill state, in order to permanently deenergize the laser and to maintain the laser permanently deenergized after the killswitch byte has been changed to the kill state.

15 Claims, 4 Drawing Sheets

KILLSWITCH ARRANGEMENT FOR AND METHOD OF REGULATING LASER OUTPUT POWER IN ELECTRO-OPTICAL READERS

FIELD OF THE DISCLOSURE

The present disclosure relates generally to a killswitch arrangement for, and a method of, regulating laser output power in electro-optical readers and, more particularly, to meeting governmental regulatory safety standards for modern lasers.

BACKGROUND

Moving laser beam readers or laser scanners, as well as solid-state imaging systems or imaging readers, have been used, in both handheld and/or hands-free modes of operation, to electro-optically read targets, such as one- and two-dimensional bar code symbols, each bearing elements, e.g., bars and spaces, of different widths and reflectivities, to be decoded, as well as non-symbol targets or forms, such as documents, labels, receipts, signatures, drivers' licenses, employee badges, and payment/loyalty cards, each bearing alphanumeric characters, to be imaged.

The moving laser beam reader generally includes a laser for emitting a laser beam, a focusing lens assembly for focusing the laser beam to form a beam spot having a certain size at a focal plane in a range of working distances, a scan component for repetitively scanning the beam spot across a target in a scan pattern, for example, a scan line or a series of scan lines, across the target multiple times per second, e.g., forty times per second, a photodetector for detecting laser light reflected and/or scattered from the target and for converting the detected laser light into an analog electrical signal, and signal processing circuitry including a digitizer for digitizing the analog signal, and a microprocessor for decoding the digitized signal. The digitized signal is then used to identify the target.

The imaging reader includes a solid-state imager or image sensor having an array of cells or photosensors that correspond to image elements or pixels in a field of view of the image sensor, an aiming light assembly having an aiming light source, e.g., an aiming laser, and an aiming lens for generating an aiming light pattern or mark on a target prior to reading, an illuminating light assembly for illuminating the field of view with illumination light from an illumination light source, e.g., one or more light emitting diodes (LEDs), and an imaging lens assembly for capturing return ambient and/or illumination light scattered and/or reflected from the target being imaged over a range of working distances and for projecting the captured light onto the array. Such an image sensor may include a one- or two-dimensional charge coupled device (CCD) or a complementary metal oxide semiconductor (CMOS) device and associated circuits for producing electronic signals corresponding to a one- or two-dimensional array of pixel information over the field of view.

As advantageous as both types of electro-optical readers have been in reading targets, it is always desirable to enhance performance. Increasing the intensity or brightness of the laser beam of the laser in the moving laser beam reader will increase the working distance range, because there will be correspondingly more return light to detect from targets that are further away from the moving laser beam reader. Similarly, increasing the intensity or brightness of the aiming laser in the imaging reader will increase performance, because the aiming pattern will be more visible to an operator, especially for targets that are further away from the imaging reader.

However, increasing the laser beam intensity too much for either the laser in the moving beam reader or the aiming laser in the imaging reader may violate human eye exposure laser safety standard limits. For example, a class 2 laser is limited to an output power of 1 mW over a base time interval of 250 msec, and a class 1 laser is limited to an output power of 0.39 mW over a base time interval of 10 sec. The laser beam intensity cannot exceed these limits not only in normal operation, but also in the event of reader malfunction or failure of laser power control circuitry specifically provided in each reader to insure that these limits are never surpassed.

The known laser power control circuitry in such readers monitored the laser current in order to provide feedback about the output power of the laser beam. Also, an internal light detector, e.g., a semiconductor monitor photodiode, was typically mounted inside the laser adjacent a semiconductor laser chip, for monitoring the output power of the laser beam. A microprocessor or programmed controller was operatively connected to the monitor photodiode, for controlling a monitored output power of the laser beam by deenergizing the laser when the monitored output power of the laser beam exceeds a safe power level limit.

For example, U.S. Pat. No. 7,609,736 disclosed a laser power control arrangement, in which power to such a laser was interrupted upon detection of an over-power condition not conforming to preestablished regulatory standards. During an operational mode, a difference between laser drive currents at two operating points was compared to a difference between laser drive currents at the same two operating points during a calibration mode. A programmed controller set the operating points by adjusting a digital potentiometer to different potentiometer settings. The over-power condition was recognized when the difference during the operational mode exceeded the difference during the calibration mode by a predetermined amount.

As advantageous as the known laser power control arrangements have been in regulating laser output power, there are special circumstances in which the laser safety standard limits could still be exceeded. For example, the monitor photodiode could become disconnected and, without corrective feedback, the laser chip could be driven with a very large amplitude drive current. As another example, a gate of a drive transistor that supplies the drive current to the laser could short, and turn the drive transistor fully on, thereby again driving the laser chip with a very large amplitude drive current. In the prior art, such a large amplitude drive current would typically cause the laser chip to burn out and be instantly destroyed. Although the laser is destroyed, at least there is compliance with the existing governmental regulatory safety standard for a laser.

However, modern lasers are typically more robust than those employed in the prior art and can sustain higher drive currents without burning out. In such circumstances, despite the presence of the known laser power control arrangements, the modern lasers are not destroyed and, when driven at the higher drive currents, continue to produce laser output powers that might exceed the safety standard limits. The difference between older and more recent lasers can mean the difference between compliance and non-compliance with the laser safety standard.

Accordingly, there is a need for an arrangement for, and a method of, regulating laser output power in electro-optical readers that complies with the governmental regulatory laser safety standards, despite the presence of high drive currents that do not cause destruction of the lasers.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
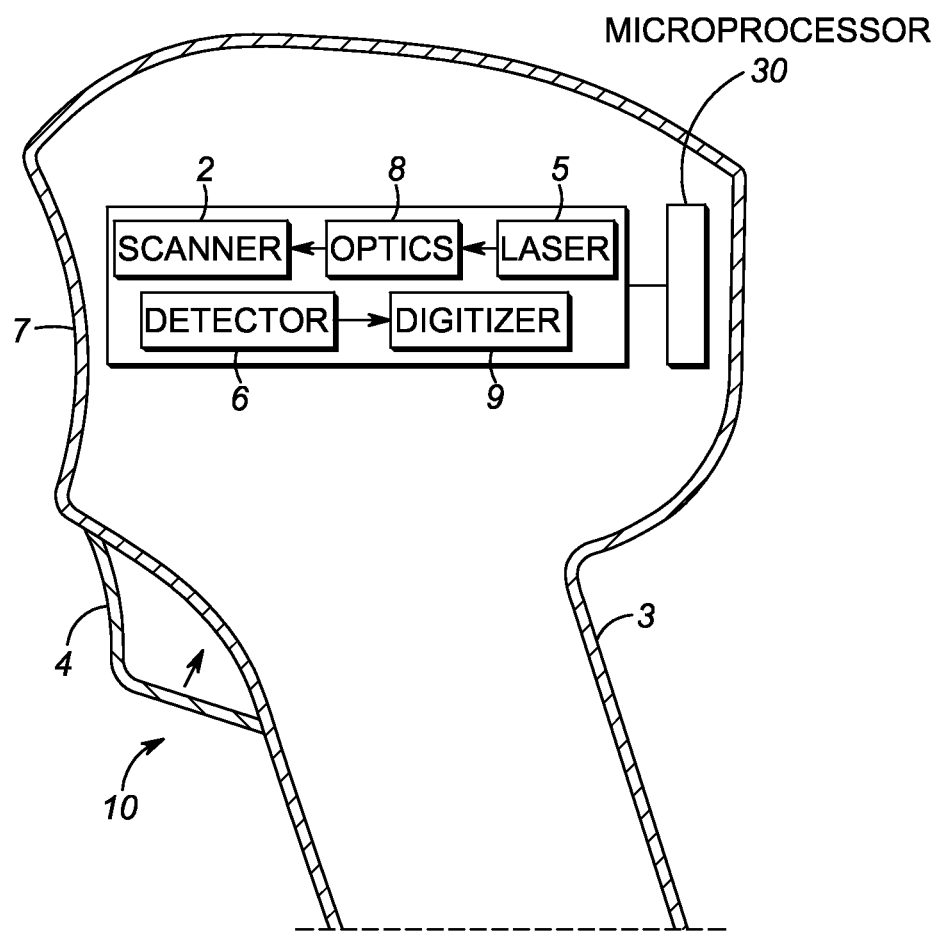
FIG. 1 is a schematic diagram of a handheld moving laser beam reader for electro-optically reading targets that can benefit from the present invention.

Skilled artisans will appreciate that elements in the figures are illustrated for simplicity and clarity and have not necessarily been drawn to scale. For example, the dimensions and locations of some of the elements in the figures may be exaggerated relative to other elements to help to improve understanding of embodiments of the present invention.

The arrangement and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

One aspect of this disclosure relates to a laser power control killswitch arrangement for regulating output power of a laser beam emitted by a laser in an electro-optical reader, e.g., a moving laser beam reader or an imaging reader. The arrangement includes a laser drive circuit for driving the laser with a drive current having an operating amplitude in an operating condition in which the output power does not exceed a laser safety level, and a fault amplitude in a fault condition in which the output power exceeds the laser safety level. The fault amplitude is greater than the operating amplitude, but is less than a burnout amplitude of a burnout drive current that causes the laser to burn out.

The arrangement further includes a memory, e.g., a non-volatile memory, for storing a killswitch byte having a default state in the operating condition, and a kill state in the fault condition. A controller is operatively connected to the memory and the laser drive circuit, and is operative for energizing the laser drive circuit when the killswitch byte is in the default state in the operating condition. The controller also detects the fault condition and responsively changes the killswitch byte to the kill state, and permanently deenergizes the laser drive circuit and maintains the laser drive circuit permanently deenergized after the killswitch byte has been changed to the kill state. This insures that the output power will not exceed the laser safety level despite the ability of the laser to withstand the greater fault amplitude of the drive current without burning out.

The laser drive circuit advantageously includes a monitor photodiode for detecting the laser beam emitted by the laser, and for generating a feedback signal that regulates the output power of the laser beam. The controller is operative for detecting the fault condition by determining when the monitor photodiode is open-circuited and cannot generate the feedback signal and/or by determining when the laser drive circuit is short-circuited. The controller advantageously checks the state of the killswitch byte prior to each operation of the reader to read a target.

A method of regulating output power of a laser beam emitted by a laser in an electro-optical reader, in accordance with another aspect of this disclosure, is performed by operating a laser drive circuit to drive the laser with a drive current having an operating amplitude in an operating condition in which the output power does not exceed a laser safety level, and a fault amplitude in a fault condition in which the output power exceeds the laser safety level. The fault amplitude is greater than the operating amplitude, but is less than a burnout amplitude of a burnout drive current that causes the laser to burn out. The method is further performed by storing a killswitch byte having a default state in the operating condition, and a kill state in the fault condition, by energizing the laser drive circuit when the killswitch byte is in the default state in the operating condition, by detecting the fault condition and responsively changing the killswitch byte to the kill state, and by permanently deenergizing the laser drive circuit and maintaining the laser drive circuit permanently deenergized after the killswitch byte has been changed to the kill state.

FIG. 1 depicts a moving laser beam reader 10 for electro-optically reading a target or indicia, such as a bar code symbol, that may use, and benefit from, the present invention. The beam reader 10 includes a scanner 2 in a handheld housing 3 having a handle on which a trigger 4 for initiating reading is mounted. The scanner 2 is operative for scanning an outgoing laser beam from a laser 5 and/or a field of view of a light detector or photodiode 6 in a scan pattern, typically comprised of one or more scan lines, multiple times per second, for example, forty times per second, through a window 7 across the symbol for reflection or scattering therefrom as return light detected by the photodiode 6 during reading. The beam reader 10 also includes a focusing lens assembly or optics 8 for optically modifying the outgoing laser beam to have a large depth of field, and a digitizer 9 for converting an electrical analog signal generated by the detector 6 from the return light into a digital signal for subsequent decoding by a microprocessor or programmed controller 30 into data indicative of the symbol being read.

Figure 2:
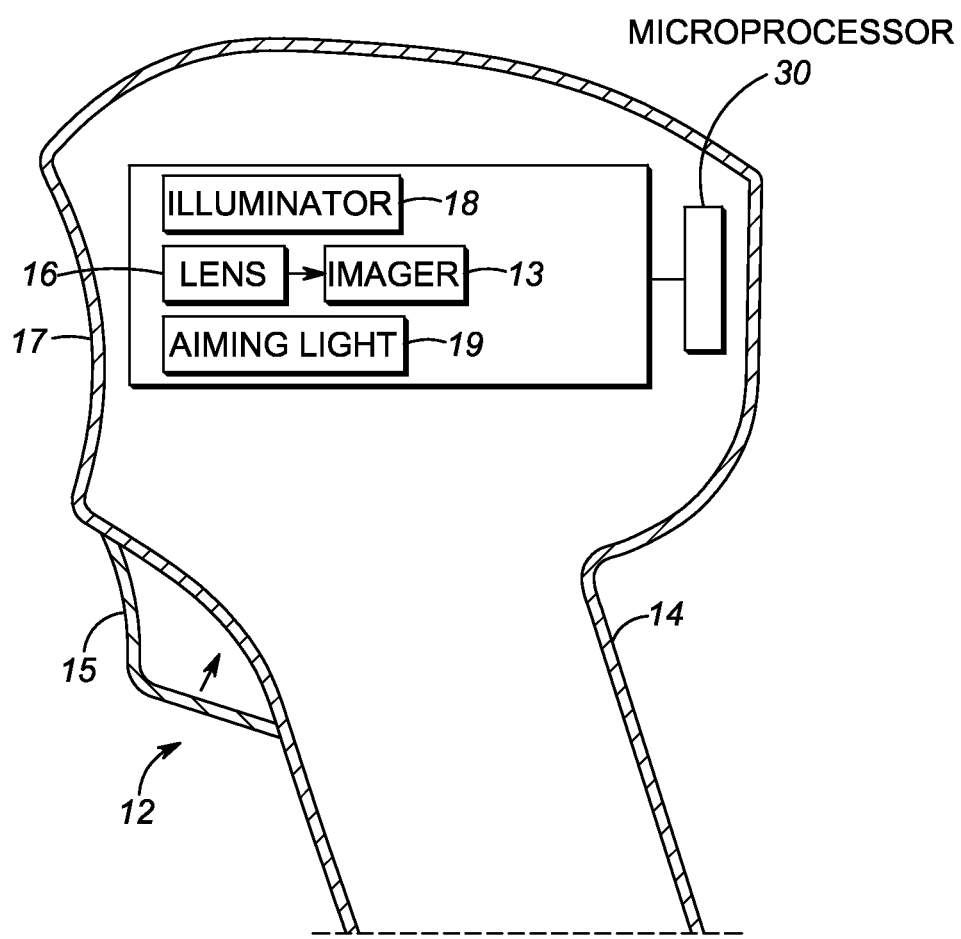
FIG. 2 is a schematic diagram of a handheld imaging reader for electro-optically reading targets that can benefit from the present invention.

FIG. 2 depicts an imaging reader 12 for imaging targets, such as indicia or bar code symbols to be electro-optically read, as well as non-symbols, which may use, and benefit from, the present invention. The imaging reader 12 includes a one- or two-dimensional, solid-state image sensor or imager 13, preferably a CCD or a CMOS array, mounted in a handheld housing 14 having a handle on which a trigger 15 for initiating reading is mounted. The imager 13 has an array of image sensors operative, together with an imaging lens assembly 16, for capturing return light reflected and/or scattered from the target through a window 17 during the imaging, and for projecting the captured light onto the imager 13, to produce an electrical signal indicative of a captured image for subsequent decoding by a controller 30 into data indicative of the symbol being read, or into a picture of the target.

When the reader 12 is operated in low light or dark ambient environments, the imaging reader 12 includes an illuminator 18 for illuminating the target during the imaging with illumination light directed from an illumination light source through the window 17. Thus, the return light may be derived from the illumination light and/or ambient light. The illumination light source comprises one or more light emitting diodes (LEDs). An aiming light generator including an aiming laser 19 may also be provided for projecting an aiming light pattern or mark on the target prior to imaging.

In operation of the imaging reader 12, the controller 30 sends command signals to drive the aiming laser 19 to project the aiming pattern on the target prior to reading, and then to drive the illuminator LEDs 18 for a short time period, say 300 microseconds or less, and to energize the imager 13 during an exposure time period of a frame to collect light from the target during said time period. A typical array needs about 16-33 milliseconds to read the entire target image and operates at a frame rate of about 30-60 frames per second. The array may have on the order of one million addressable image sensors.

Figure 3:
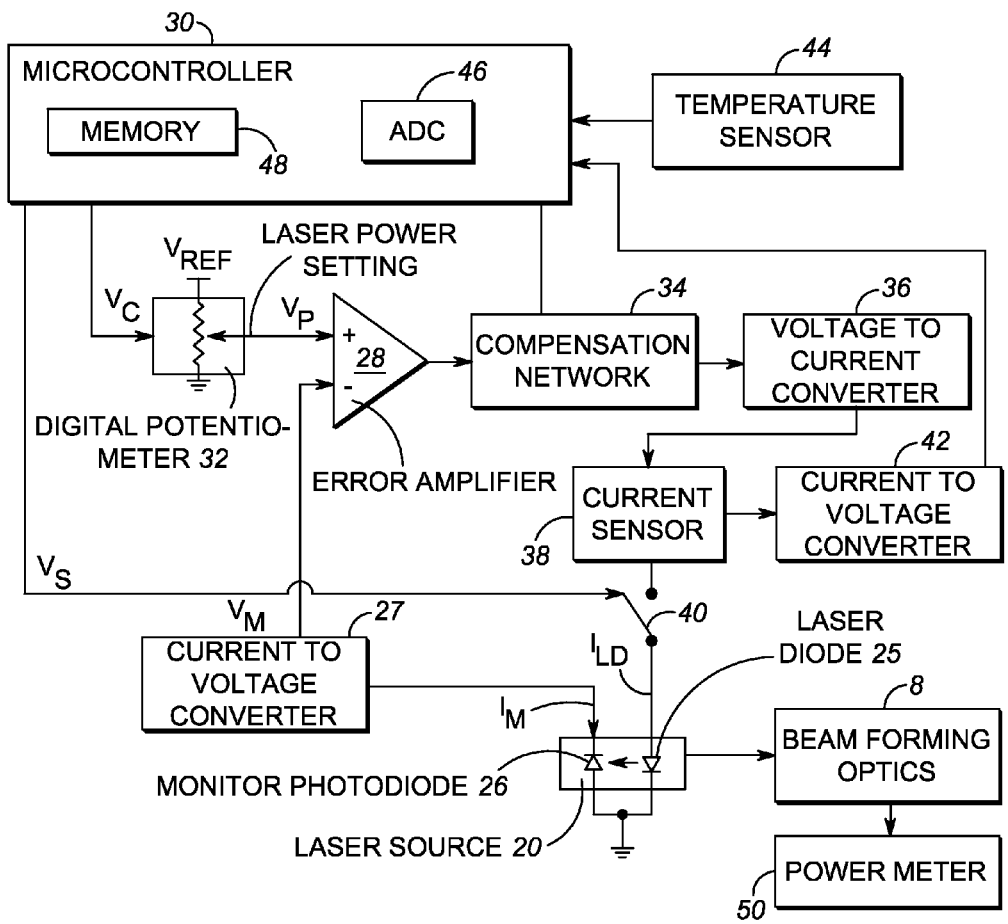
FIG. 3 is an electrical circuit schematic of a killswitch arrangement for and a method of controlling a laser used in the readers of FIGS. 1-2 in accordance with the present invention.

The laser 5 of FIG. 1, or the aiming laser 19 of FIG. 2, is shown in FIG. 3 as a packaged semiconductor laser source 20, whose output power is to be regulated by the illustrated arrangement. The laser source 20 includes a semiconductor laser chip or diode 25 and a semiconductor monitor photodiode 26 within the laser source. The monitor photodiode 26 is operative for monitoring the raw output power of the diode 25. The photodiode 26 is part of a feedback circuit operative for maintaining the laser output power constant. The feedback circuit includes a current to voltage converter 27 for converting the monitor drive current $I_M$ flowing through the monitor photodiode 26 to a monitor drive voltage $V_M$ which, in turn, is connected to a negative terminal of an error amplifier 28. A microcontroller 30, preferably the same one used to read the target in the readers 10 and 12, generates, as described below, respective digital control signals $V_c$ to set a digital potentiometer 32 to respective potentiometer settings. An output signal $V_p$ from the potentiometer 32 is conducted to a positive terminal of the error amplifier 28, and an output of the error amplifier 28 is conducted to a compensation network 34 whose output voltage is converted to a current by a voltage to current converter 36 which, in turn, is connected to a current sensor 38. The compensation network 34, the voltage to current converter 36, and the current sensor 38 comprise a laser drive circuit, as described below.

The current flowing through the current sensor 38 is conducted through a normally closed power switch 40 to the laser diode 25 to energize the same with a drive current $I_{LD}$ to emit the laser beam 14 with an output power. The current flowing through the current sensor 38 is also preferably reduced in amplitude by flowing through a divider and is converted by a current to voltage converter 42 to a voltage which is fed back to the microprocessor 30 via an analog to digital converter (ADC) 46. A temperature sensor 44 is also connected to the ADC 46 to apprise the microcontroller of the temperature. Also, the microprocessor is associated with a memory 48 in which data is stored. A power meter 50 measures the output power of the laser beam. The interior monitor photodiode 26 detects changes in raw output power of the laser beam emitted by laser diode 25 and sends a feedback signal to the error amplifier 28 to allow more or less drive current to pass through the laser diode 25. The greater this drive current, the greater the laser output power, and vice versa.

As described so far, the arrangement of FIG. 3 has the same structure and function as the arrangement disclosed in U.S. Pat. No. 7,609,736, the entire contents of which are hereby incorporated herein by reference thereto. By way of brief review, this patent disclosed a laser power control arrangement, in which power to such a laser was interrupted upon detection of an over-power condition not conforming to pre-established regulatory standards. During an operational mode, a difference between laser drive currents at two operating points was compared to a difference between laser drive currents at the same two operating points during a calibration mode. The programmed controller 30 set the operating points by adjusting the digital potentiometer 32 to different potentiometer settings. The over-power condition was recognized when the difference between the laser drive currents during the operational mode exceeded the difference between the laser drive currents during the calibration mode by a predetermined amount.

In accordance with the present disclosure, as advantageous as the known laser power control arrangement of U.S. Pat. No. 7,609,736 has been in regulating laser output power, there are special circumstances in which the laser safety standard limits could still be exceeded. For example, the monitor photodiode 26 could become disconnected and open-circuited and, without corrective feedback, the laser diode 25 could be driven with a very large amplitude drive current. As another example, a gate of a drive transistor within the laser drive circuit 34, 36, 38 that supplies the drive current to the laser diode 25 could short, and turn the drive transistor fully on, thereby again driving the laser chip with a very large amplitude drive current. In the prior art, such a large amplitude drive current would typically cause the laser diode 25 to burn out and be instantly destroyed. Although the laser diode 25 is destroyed, at least there is compliance with the existing governmental regulatory safety standard for a laser.

However, modern lasers are typically more robust than those employed in the prior art and can sustain higher drive currents without burning out. In such circumstances, despite the presence of the known laser power control arrangement of U.S. Pat. No. 7,609,736, the modern laser sources 20 are not destroyed and, when driven at the higher drive currents, continue to produce laser output powers that might exceed the safety standard limits.

Hence, in accordance with the present disclosure, a killswitch arrangement is provided for regulating the output power of the laser beam emitted by the laser source 20. The killswitch arrangement may be operated independently of, or successively after, the known laser power control arrangement is operated. Thus, the laser drive circuit 34, 36, 38 is operative for driving the laser diode 25 with a drive current $I_{LD}$ having an operating amplitude in an operating condition in which the output power does not exceed a laser safety level, and a fault amplitude in a fault condition in which the output power exceeds the laser safety level. The fault amplitude is greater than the operating amplitude, but is less than a burnout amplitude of a burnout drive current that causes the laser diode 25 to burn out.

The killswitch arrangement includes the memory 48, e.g., a non-volatile memory, for storing a killswitch byte having a default state (e.g., logic "0") in the operating condition, and a kill state (e.g., logic "1") in the fault condition. The controller 30 is operatively connected to the memory 48 and the laser drive circuit 34, 36, 38, and is operative for energizing the laser drive circuit when the killswitch byte is in the default state in the operating condition. The controller 30 also detects the fault condition and responsively changes the killswitch byte to the kill state, and permanently deenergizes the laser drive circuit 34, 36, 38 and maintains the laser drive circuit 34, 36, 38 permanently deenergized after the killswitch byte has been changed to the kill state. This insures that the output power will not exceed the laser safety level despite the ability of the laser source 20 to withstand the greater fault amplitude of the drive current without burning out.

Figure 4:
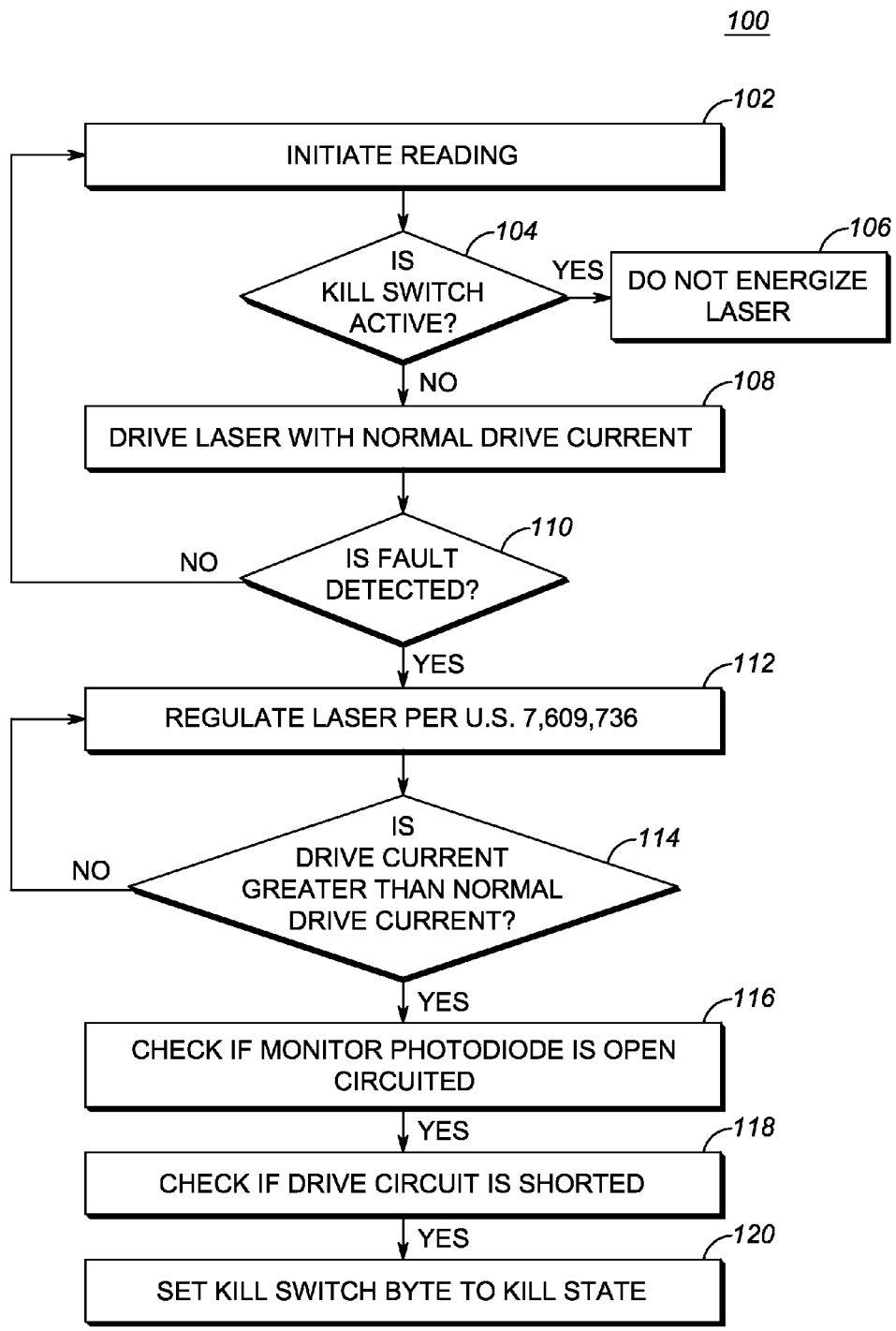
FIG. 4 is a flow chart depicting steps performed in accordance with the method of the present disclosure.

More specifically, with reference to the flow chart 100 of FIG. 4, reading of a target is initiated at block 102, e.g., by manually actuating either trigger 4, 15, and then, the controller 30 checks whether the killswitch byte is active in block 104, i.e, whether the killswitch byte is in the kill state. If so, then the controller 30 does not energize the laser 20. If not, then the laser 20 is driven by the laser drive circuit in its normal operation (block 108), i.e., with the drive current $I_{LD}$ having an operating amplitude in an operating condition in which the output power does not exceed a laser safety level.

The controller 30 monitors for faults in block 110. If no fault is detected, then reading continues for another target. If a fault is detected, then the controller 30 regulates the laser 20 as described in U.S. Pat. No. 7,609,736 (block 112). This is sufficient in most circumstances for insuring that the output power of the laser 20 does not exceed safety levels.

However, as explained above, there are times when special circumstances cause the output power of the laser 20 to exceed safety levels. Thus, the controller 30 checks, in block 114, whether the fault amplitude of the drive current is greater than the operating amplitude of the drive current. If so, then the controller 30 checks whether the monitor photodiode 26 is open-circuited in block 116, or whether the laser drive circuit 34, 36, 38 is shorted in block 118. If so, then the controller 30 sets the killswitch byte from its inactive, default state to the aforementioned kill state in block 120. The next time that reading is initiated (block 102), the laser 20 will not be turned on (block 106). The laser 20 has been "bricked".

One way of checking whether the monitor photodiode is open-circuited involves changing the gain of the converter 27 and checking whether the monitor drive voltage $V_M$ at a low gain and at a high gain exceeds a predetermined value. One way of checking whether the laser drive circuit 34, 36, 38 is shorted involves measuring the output of converter 42 with the ADC 46.

In addition, to add robustness to the disclosed software-assisted killswitch arrangement, and to ensure that the laser 20 is not turned completely off in the case of a first false positive detection, other signals can also be monitored. For example, the monitor drive current from the monitor photodiode 26 is an indicator of the laser's power. This can also be measured. The decision to permanently turn off the laser 20 using this software-assisted method can be made by consideration of the state of the multiple signals.

As described so far, the present disclosure relates to regulating the output power of a laser to meet governmental safety standards. Similar standards, however, apply to non-laser light sources, such as high power light emitting diodes (LEDs). Hence, this disclosure is not intended to be limited to lasers, but is equally applicable to LEDs. It is common for the aiming light 19 and/or the illuminator 18 in FIG. 2 to comprise one or more LEDs.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by "comprises . . . a," "has . . . a," "includes . . . a," or "contains . . . a," does not, without more constraints, preclude the existence of additional identical elements in the process, method, article, or apparatus that comprises, has, includes, or contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1%, and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors, and field programmable gate arrays (FPGAs), and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein, will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

The invention claimed is:

1. A laser power control killswitch arrangement for regulating output power of a laser beam emitted by a laser in an electro-optical reader, comprising:
   a laser drive circuit for driving the laser with a drive current having an operating amplitude in an operating condition in which the output power does not exceed a laser safety level, and a fault amplitude in a fault condition in which the output power exceeds the laser safety level, and wherein the fault amplitude is greater than the operating amplitude, but is less than a burnout amplitude of a burnout drive current that causes the laser to burn out;
   a memory for storing a killswitch byte having a default state in the operating condition, and a kill state in the fault condition;
   a controller operatively connected to the memory and the laser drive circuit, and operative for energizing the laser drive circuit when the killswitch byte is in the default state in the operating condition, for detecting the fault condition and for responsively changing the killswitch byte to the kill state, and for permanently deenergizing the laser drive circuit and for maintaining the laser drive circuit permanently deenergized after the killswitch byte has been changed to the kill state, thereby insuring that the output power will not exceed the laser safety level despite the ability of the laser to withstand the greater fault amplitude of the drive current without burning out, and wherein said detecting the fault condition comprises detecting whether the fault amplitude of the drive current is greater than the operating amplitude of the drive current; and
   wherein the controller is operative for checking the state of the killswitch byte after manually actuating a trigger but prior to driving the laser with a normal drive current and for driving the laser with the normal drive current only if the killswitch byte is not set to the kill state.

2. The arrangement of claim 1, wherein the laser drive circuit includes a monitor photodiode for detecting the laser beam emitted by the laser, and for generating a feedback signal that regulates the output power of the laser beam; and wherein the controller is operative for detecting the fault condition by determining when the monitor photodiode is open-circuited and cannot generate the feedback signal.

3. The arrangement of claim 1, wherein the controller is operative for detecting the fault condition by determining when the laser drive circuit is short-circuited.

4. The arrangement of claim 1, wherein the memory is a non-volatile memory, and wherein the controller permanently sets the killswitch byte to the kill state once the fault condition has been detected.

5. The arrangement of claim 1, wherein the laser is mounted in a housing of a moving laser beam reader, and wherein the laser beam passes through a window supported by the housing in the operating condition.

6. The arrangement of claim 1, wherein the laser is mounted in a housing of an imaging reader, and wherein the laser beam passes through a window supported by the housing in the operating condition.

7. A method of regulating output power of a laser beam emitted by a laser in an electro-optical reader, comprising:
   operating a laser drive circuit to drive the laser with a drive current having an operating amplitude in an operating condition in which the output power does not exceed a laser safety level, and a fault amplitude in a fault condition in which the output power exceeds the laser safety level, and wherein the fault amplitude is greater than the operating amplitude, but is less than a burnout amplitude of a burnout drive current that causes the laser to burn out;
   storing a killswitch byte having a default state in the operating condition, and a kill state in the fault condition;
   energizing the laser drive circuit when the killswitch byte is in the default state in the operating condition;
   detecting the fault condition and responsively changing the killswitch byte to the kill state, wherein said detecting the fault condition comprises detecting whether the fault amplitude of the drive current is greater than the operating amplitude of the drive current;
   permanently deenergizing the laser drive circuit and maintaining the laser drive circuit permanently deenergized after the killswitch byte has been changed to the kill state, thereby insuring that the output power will not exceed the laser safety level despite the ability of the laser to withstand the greater fault amplitude of the drive current without burning out; and
   checking the state of the killswitch byte after manually actuating a trigger but prior to driving the laser with a normal drive current and for driving the laser with the normal drive current only if the killswitch byte is not set to the kill state.

8. The method of claim 7, and detecting the laser beam emitted by the laser with monitor photodiode that generates a feedback signal that regulates the output power of the laser beam; and wherein the detecting of the fault condition is performed by determining when the monitor photodiode is open-circuited and cannot generate the feedback signal.

9. The method of claim 7, wherein the detecting of the fault condition is performed by determining when the laser drive circuit is short-circuited.

10. The method of claim 7, and permanently setting the killswitch byte to the kill state in a non-volatile memory once the fault condition has been detected.

11. The method of claim 7, and mounting the laser in a housing of a moving laser beam reader, and passing the laser beam through a window supported by the housing in the operating condition.

12. The method of claim 7, and mounting the laser in a housing of an imaging reader, and passing the laser beam through a window supported by the housing in the operating condition.

13. A power control killswitch arrangement for regulating output power of a light beam emitted by a light source in an electro-optical reader, comprising:
   a drive circuit for driving the light source with a drive current having an operating amplitude in an operating condition in which the output power does not exceed a safety level, and a fault amplitude in a fault condition in which the output power exceeds the safety level, and wherein the fault amplitude is greater than the operating amplitude, but is less than a burnout amplitude of a burnout drive current that causes the light source to burn out;
   a memory for storing a killswitch byte having a default state in the operating condition, and a kill state in the fault condition; and
   a controller operatively connected to the memory and the drive circuit, and operative for energizing the drive circuit when the killswitch byte is in the default state in the operating condition, for detecting the fault condition and for responsively changing the killswitch byte to the kill state, and for permanently deenergizing the drive circuit and for maintaining the drive circuit permanently deenergized after the killswitch byte has been changed to the kill state, thereby insuring that the output power will not exceed the safety level despite the ability of the light source to withstand the greater fault amplitude of the drive current without burning out, and wherein said detecting the fault condition comprises detecting whether the fault amplitude of the drive current is greater than the operating amplitude of the drive current; and wherein the controller is operative for checking the state of the killswitch byte after manually actuating a trigger but prior to driving the laser with a normal drive current and for driving the laser with the normal drive current only if the killswitch byte is not set to the kill state.

14. The arrangement of claim 13, wherein the light source is one of a laser and a light emitting diode.

15. The arrangement of claim 13, wherein the memory is a non-volatile memory, and wherein the controller permanently sets the killswitch byte to the kill state once the fault condition has been detected.

\* \* \* \* \*